United States Patent [19]
Fitzgerald, Jr. et al.

[11] Patent Number: 4,811,246
[45] Date of Patent: Mar. 7, 1989

[54] MICROPOSITIONABLE PIEZOELECTRIC CONTACTOR

[76] Inventors: William M. Fitzgerald, Jr., 2907 Calle Guadalajara, San Clemente, Calif. 92672; Steven L. Petersen, 5110 Woodwind La., Anaheim, Calif. 92807; John G. Waters, 6194 Promontory La., Riverside, Calif. 92506

[21] Appl. No.: 837,801

[22] Filed: Mar. 10, 1986

[51] Int. Cl.$^4$ .................. H01L 41/00; G01R 11/04; B01D 3/42; G01B 21/00

[52] U.S. Cl. ..................... 364/550; 364/559; 324/73 AT; 324/158 P; 310/328; 200/181

[58] Field of Search ............ 364/489, 488, 480, 490, 364/491, 550, 551, 552, 559, 560, 468, 478; 310/328; 324/73 AT, 73 PC, 158 F, 158 P; 200/181

[56] References Cited

U.S. PATENT DOCUMENTS

| | | | |
|---|---|---|---|
| 3,009,109 | 11/1961 | Jankowski | 324/73 AT |
| 3,202,952 | 8/1965 | Rayburn | 324/73 AT |
| 3,596,718 | 3/1971 | Borner | 310/328 |
| 3,902,084 | 8/1975 | May, Jr. | 310/328 |
| 4,070,565 | 1/1978 | Borrelli | 364/490 |
| 4,093,883 | 6/1978 | Yamamoto | 200/181 |
| 4,195,258 | 3/1980 | Yen | 324/73 AT |
| 4,258,325 | 3/1981 | Richardson | 324/158 F |
| 4,267,507 | 5/1981 | Guerpont | 324/158 P |
| 4,384,230 | 5/1983 | Wisner | 310/328 |
| 4,403,166 | 9/1983 | Tanaka et al. | 200/181 |
| 4,419,626 | 12/1983 | Cedrone et al. | 324/158 P |
| 4,454,442 | 6/1984 | Hosking | 310/328 |
| 4,528,500 | 7/1985 | Lightbody et al. | 324/73 PC |
| 4,546,658 | 10/1985 | Rocha et al. | 310/338 |
| 4,550,406 | 10/1985 | Neal | 371/20 |
| 4,553,843 | 11/1985 | Langley et al. | 356/375 |
| 4,599,559 | 7/1986 | Evans | 324/158 P |
| 4,633,176 | 12/1986 | Reimer | 324/158 P |
| 4,634,917 | 1/1987 | Dvorsky et al. | 310/328 |
| 4,673,839 | 6/1987 | Veenendaal | 324/158 P |

FOREIGN PATENT DOCUMENTS

| | | |
|---|---|---|
| 54-12678 | 1/1979 | Japan . |
| 2105050 | 3/1983 | United Kingdom . |

OTHER PUBLICATIONS

Robert Albrow, "2-Head Auto-Test System Takes on Complex VLSP", Electronic Design, vol. 29, No. 5, pp. 79-84.

Primary Examiner—Parshotam S. Lall
Assistant Examiner—Steven Melnick
Attorney, Agent, or Firm—Roy A. Ekstrand

[57] ABSTRACT

A micropositionable contactor for use in automated testing of multiterminal electronic devices includes an elongated metal probe having a contact at one end. A plurality of piezoelectric motors are positioned about the probe are operative to move the probe in a corresponding plurality of directions. Digital electronic circuit means are coupled to the piezoelectric motors to move the probe through a sequence of motions which establish the locations of each contact on the device under test and make appropriate testing connections to one or more of the device contacts.

10 Claims, 4 Drawing Sheets

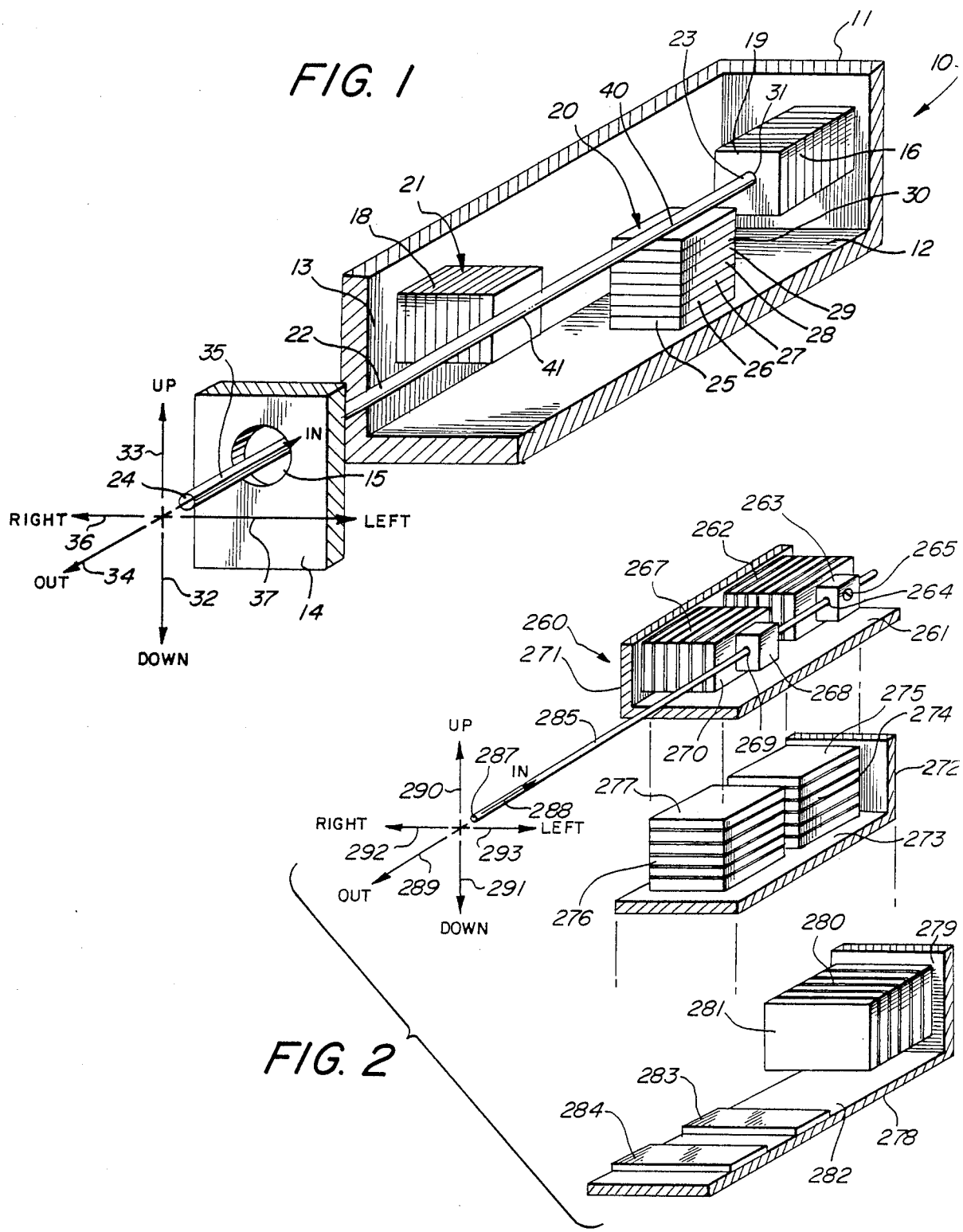

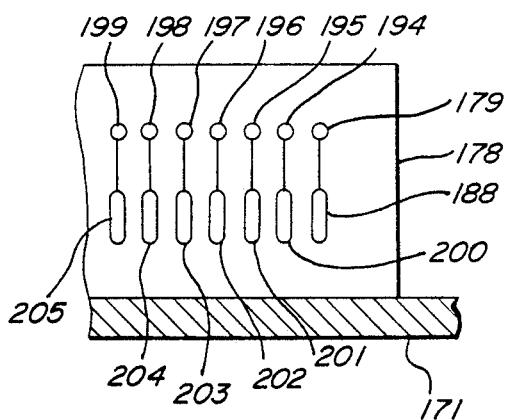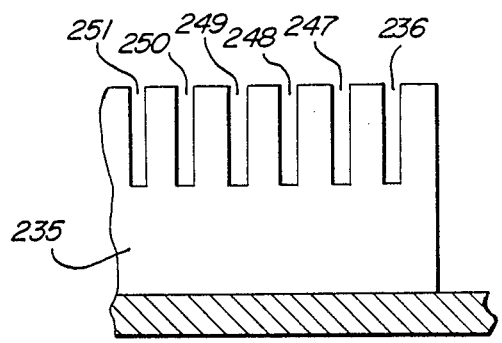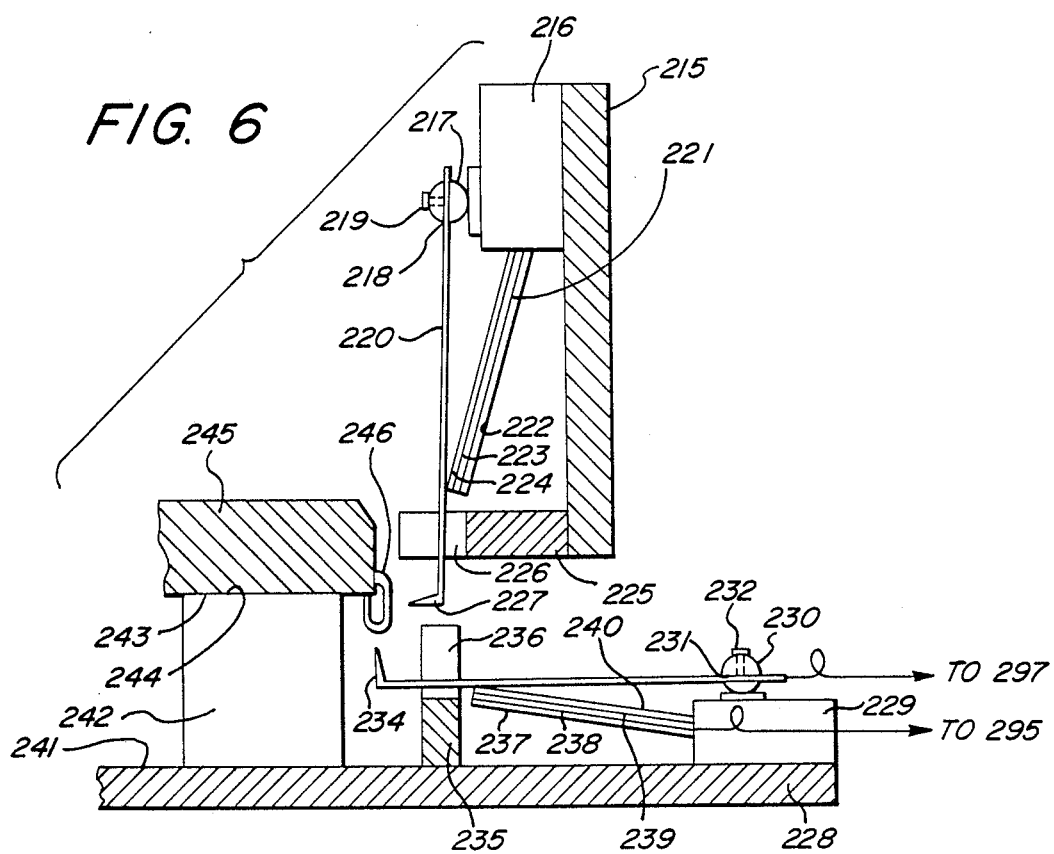

MICROPOSITIONABLE PIEZOELECTRIC CONTACTOR

BACKGROUND OF THE INVENTION

The present invention relates generally to automated testing of microelectric devices and particularly to computerized automated testing systems for microelectronic devices and the like in which it is desirable to measure the physical dimensions of the array of connectors on a microelectronic the device.

The dramatic increase in the production of microelectronic circuit devices and components such as integrated circuits using mass production methods has created a need in the art for high density, high speed, automated contactors to provide temporary testing connections to the micro electronic device contacts. While the structure of microelectronic devices varies considerably, most comprise a small circuit component or group of components supported on a small substrate. A plurality of electrical contacts on the substrate periphery are electrically connected to the circuit devices. During testing, probes or contacts are temporarily brought into contact with these peripheral contacts.

The majority of the testing systems devised to date for providing these temporary testing connections still rely upon the same basic mechanical technology previously utilized by the much larger printed circuit board testers and the like in that a group of metallic probes is mechanically positioned about the periphery of the device under test. in most such prior art testing systems, the alignment of the testing probe contactor and the appropriate contact on the device under test is achieved through the use of either precise control of the manufacturing process of the device and a coordinated precision on the placement of the testing probes, or in the alternative, precision optical systems under the control of an operator. In the latter system, manual adjustments of probe position are used to properly engage the desired contact for the device under test. In either system, little can be achieved with such testing devices beyond the temporary electrical connections and testing operation of device performance. That is to say, the present systems do not provide for a mechanical measurement of the geometry of the device under test.

The choice of which type of test system to be utilized is generally a choice between the need for speed versus the need for precision. The above-desired precision mechanical configuration provides speed of connection and testing and is often fully automatable but relies upon close mechanical tolerances to assure adequate electrical contact pressure for reliable connection and little can be done to compensate for geometric variations of the device under test. In addition, care must be taken to avoid or minimize over stressing of the device under test and the resulting mechanical damage to the device. This is made difficult in the absence of direct feedback of contact pressure. The optical systems described suffer some disadvantage in the speed of operation in that they are not fully automated. However, optical systems do permit or accept greater tolerance variations in the device under test. In either event, the prior art testing systems described do not accurately measure device geometry and do not readily establish consistent contact pressures independent of device geometry tolerance.

In another area of developing technology, the use of piezoelectric materials which provide the property of bilateral electromechanical transduction has emerged. For the most part, such piezoelectric materials have been utilized to produce electrically operable relay and switch structures in which mechanical motion of a contact or group of contacts is accomplished in response to a voltage applied to a piezoelectric element. Piezoelectric materials exist primarily in two forms. The first is referred to as a single crystal structure while the second is referred to as a ceramic or polycrystaline material. In either case, such piezoelectric materials include, among their other properties, a bilateral relationship between the deformation of the material (that is a change in geometry) and the applied electrical field. As an electromechanical transducer, the application of a electrical field to the piezoelectric material causes it to deform or change geometry. The change in geometry or deformation, is for any given material, predictable and is a function of the fabrication of the material and the orientation of its crystal structure. Conversely, the application of mechanical pressure to the piezoelectric material produces an electrical field. As a result, piezoelectric materials have the capability to impart mechanical motion to an attached object in response to an applied electrical field.

As mentioned, this property of piezoelectric materials has been utilized, for example, in U.S. Pat. No. 4,454,442 in constructing a euler lever piezoelectric relay. In the structure shown, a euler lever, which forms one contact of a contact pair, is captivated between a pair of piezoelectric members. A second stationary contact is positioned near the euler lever. A voltage is applied to either or both of the piezoelectric members causing deformation and a consequent altering of the configuration of the euler lever. This in turn results in a change in the distance between the contact on the euler lever and the stationary contact. Another switch structure utilizing a piezoelectric material is set forth in U.S. Pat. No. 4,093,883 in which a piezoelectric multimorph switch structure includes a laminated piezoelectric element which moves or bends in response to an applied voltage which creates a potential gradiant across the laminated element. Because of the multi-layered construction of the piezoelectric element, geometric deformation or changes of the piezoelectric materials results in creation of a bending motion. A contact born by the multi-layered piezoelectric material is selectively moved into or out of electrical connection with a second contact born on a second similarly configured piezoelectric multi-layered structure. The second piezoelectric structure is oriented in the opposite direction to the first piezoelectric structure and the thrust of U.S. Pat. No. 4,093,883 is to provide a structure which takes advantage of the opposite bending characteristics of the oppositely poled piezoelectric members to provide improved switching action and increased contact-to-contact pressure.

U.S. Pat. No. 4,403,166 sets forth a piezoelectric relay with oppositely bending bimorphs. A bimorph comprises a two layered piezoelectric structure which reacts to an applied voltage in a manner similar to the reaction of a bimetallic element to heat. The structure shown provides a piezoelectric relay which a pair of bimorph motors are supported in a cantilever fashion such that each bimorph has one end held in a fixed position while the other end remains free and is moved by the action bending of the piezoelectric bimorph elements. Contacts are supported upon the moveable ends of the cantilever bimorphs and, as a result, are brought into or moved from positions of connection with each other to produce a relay action.

While the prior art testings systems, such as those described above, provide some measure of either automated testing or precision. They do not provide for accurate high speed precision testing of microelectronic devices. Similarly, the presently used piezoelectric structures, such as those shown in the art and described above, provide for utilization of piezoelectric motors to move one or more electrical contacts in response to an applied signal. They do not, however, provide precision control of the location of contact and applied contact pressure required for structures which may be used to obtain the high speed mass production testing of microelectric devices. There remains therefore, a need in the art for a high speed precision controlled automated testing system suitable for use in testing microelectronic circuit devices.

SUMMARY OF THE INVENTION

It is a general object of the invention to provide an improved system for automated testing of microelectronic devices. It is a more particular object of the present invention to provide an improved system for automated testing of microelectronic devices in which the testing system provides a constant repeatable contact engagement and contact force notwithstanding tolerance variations in microelectronic device geometry. It is a still more particular object of the present invention to provide an improved automated testing system for microelectronic devices in which the initial testing process provides precision information as to the geometry of the device under test.

In accordance with the invention there is provided a micro positionable contactor for use in establishing testing connections to selected terminals of a device under test which comprises a probe supporting an electrical contact and means for making electrical connections to the contact, a piezoelectric motor responsive to an applied voltage and mechanically coupled to and acting upon the probe to move the electrical contact of the probe to selected positions in response to a predetermined applied voltage. A voltage source including a computer and digital to analog converter is coupled to the piezoelectric motor such that digital coded position signals produced by the computing means and applied to the digital to analog converter produce corresponding precision voltages applied to the piezoelectric motor. Sensing means coupled to the motor structure respond to the establishment of electrical connection between the contact and the selected terminal of the device under test. In one mode of operation, the computing means increment the digital signal applied to the digital to analog converter to produce corresponding voltage increment changes which in turn are applied to the piezoelectric motor which in turn produce incremental changes in contact position.

BRIEF DESCRIPTION OF THE DRAWINGS

The features of the present invention which are believed to be novel are set forth with particularity in the appended claims. The invention, together with further objects and advantages thereof, may best be understood by reference to the following description taken in conjunction with the accompanying drawings in the several figures of which like reference numerals identify like elements, and in which:

FIG. 1 is a simplified perspective view of a portion of a micropositionable contactor constructed in accordance with the present invention;

FIG. 2 is a simplified perspective view of a portion of an alternate embodiment of a micropositionable contactor constructed in accordance with the present invention;

FIG. 5 is a frontal view of a portion of the pin guide of the micrpositionable contactor system shown in FIG. 4;

FIG. 6 is a section view of a portion of a micropositionable contactor constructed in accordance with the present invention which employs bimorph piezoelectric motors;

FIG. 7 is a frontal view of a portion of the pin guide of the micropositionable contactor shown in FIG. 6.

DESCRIPTION OF THE PREFERRED EMBODIMENTS

Figure 3:
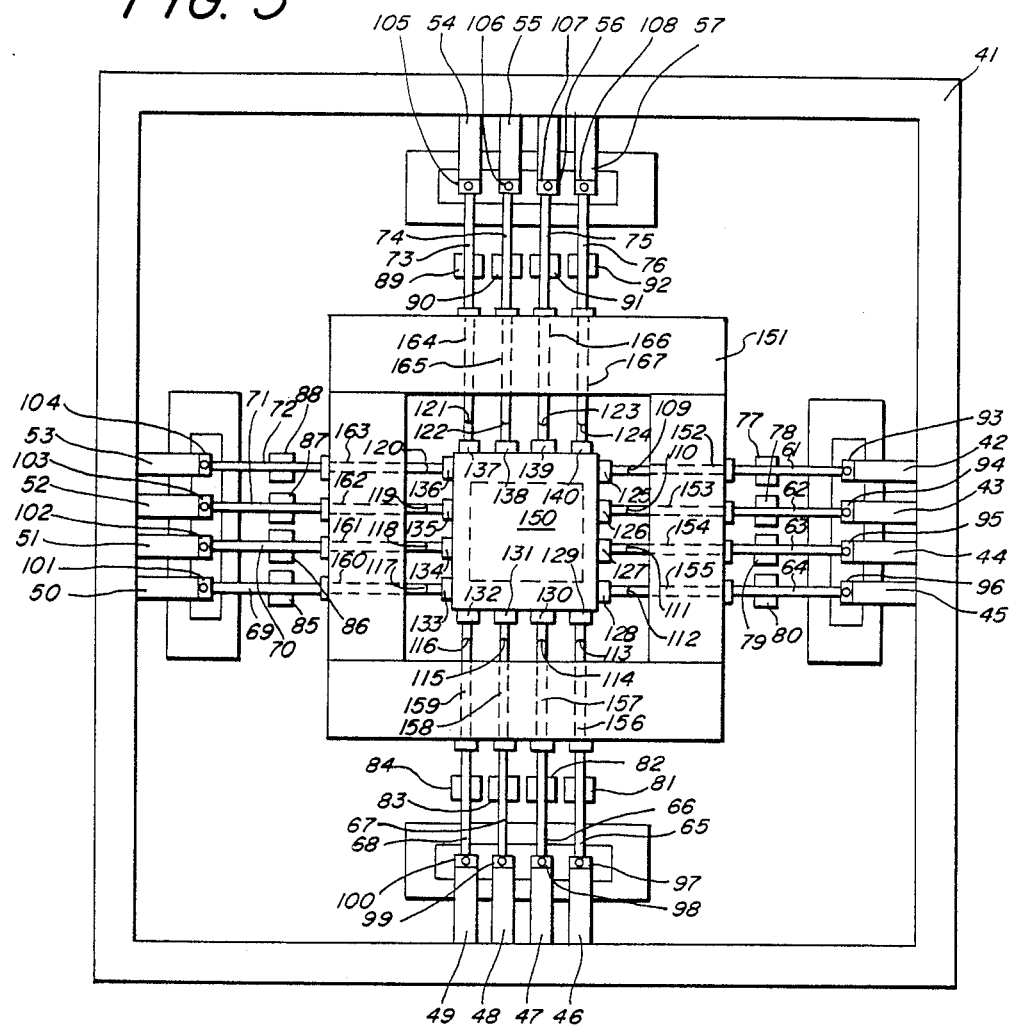
FIG. 3 is a plan view of a portion of a micropositioned contactor system constructed in accordance with the present invention.

FIG. 1 sets forth a simplified prespective view of the contactor probe and probe moving combination of the present invention micropositionable contactor generally described by the reference number 10, in which a vertical support 11, a support floor 12 and a support wall 13 provide a trio of mutually perpendicular motor supports. An in/out motor 16 is attached to vertical support 11 at one end and bears a in/out feedback transducer 19 at its other end. In/out motor 16 is a piezoelectric stacked motor configuration, the details of construction of which are set forth below in greater detail. In/out motor 16 further includes a probe attachment 31 overlying the outer surface of in/out feedback transducer 19. A vertical motor 17 also comprising a stacked piezoelectric motor is secured to support floor 12 at one end and supports a vertical feedback transducer 20 at the other end. A probe attachment means 40 is supported on feedback transducer 20. A lateral motor 18 also comprising a piezoelectrical stack motor is attached at one end to vertical support wall 13 and bears a lateral feedback transducer 21 at the other end. A probe attachment 41 is supported upon lateral feedback transducer 21. An elongated generally cylindrical metal probe 22 defines a fixed end 23 attached to in/out feedback transducer 19 by probe attachment 31 in a fixed cantilever structure. Probe 22 further defines a probe contact 24 supported on the end of probe 22 opposite from fixed end 23. Probe 22 passes across vertical feedback transducer 20 and is attached thereto by probe attachment 40 and passes across lateral feedback transducer 21 and is attached thereto by probe attachment 41. A pin guide 14 comprising a substantially planar structure is interposed between probe contact 24 and lateral motor 18 and defines a generally circular pin aperture 15. Probe 22 extends through pin aperture 15.

It should be noted that the micropositionable contactor shown in FIG. 1 is for clarity a simplified rendition which will be utilized to describe the basic functions of the probe positioning operation of motors 16, 17 and 18 and is not a completed system. It should be understood further that in the complete embodiment in the present invention micropositionable contactor, a plurality of electrical connections are placed on each of the piezoelectric stack motors 16, 17 and 18.

Piezoelectric motors 16, 17 and 18 are each constructed in the embodiment shown in FIG. 1 of substantially the same stacked motor configuration. By way of example, vertical motor 17 comprises a plurality of stacked laminations 25 through 30 inclusive. In the typical stack motor configuration, the laminations are arranged in repeated combinations in which lamination 25 comprises a metal layer 26 being formed of piezoelectric material, layer 27 formed of metal, layer 28 comprising an insulating material, such as epoxy, layer 29 comprising a layer of metal and layer 30 comprising a layer of piezoelectric material. The sequence of layers repeats for the stack configuration with each piezoelectric layer having a metal layer above and below it and each pair of metal layers that is not separated by a piezoelectric layer being insulated from each other by a layer of epoxy material. As a result, the structure results in which pairs of metal layers, having appropriate electrical conduction paths attached to them, may be energized by an applied voltage to produce an electrical field through the piezoelectric material. The purpose of the interposed epoxy insulating layers, such as layer 28 in vertical motor 17, is to provide sufficient insulation between adjacent metal layers to permit a different voltage on each. While the structure shown for vertical motor 17 comprises layers 25 through 30, it should be understood that in the actual fabrication of the piezoelectric stacked motors of the present invention system, a great many more laminations are utilized. It should be further understood that the thickness of metal laminations 25, 27 and 29 as well as epoxy lamination 28, are shown having an exaggerated thickness to facilitate drawing clarity. In the actual piezoelectric stacked motor structure, the fabrication of metal layers comprises an extremely thin vacuum deposited layer much thinner than the lamination of piezoelectric material. Similarly, the thickness of the epoxy layer is limited to that thickness sufficient to firmly bond the three layer groups of piezoelectric lamination and vapor deposited metal to the next succeeding combination of vapor deposited metal layers surrounding a piezoelectric lamination. Because the accuracy repeatability and predictability of piezoelectric material dimension change with voltage is increased for thinner piezoelectric laminations, the structure of the stacked piezoelectric motors 16, 17 and 18 of the present invention micropositionable contactor utilizes a large number of relatively thin piezoelectric laminations. In accordance with an important advantage of the present invention structure set forth and discussed below in greater detail, piezoelectric motors 16, 17 and 18 are designed with such high number of layers to provide extremem accuracy in the precision and repeatability of motor elongation or geometry change for a specific voltage. Further, in some applications, the piezoelectric motor may be biased with a fixed voltage to establish a neutral position. In such cases, the applied singal will either add to or subtract from the bias signal and provide bidirectional control of the motor.

Piezoelectric motors 16, 17 and 18 each support a respective feedback transducer 19, 20 and 21 interposed between the piezoelectric motor and the attachment to probe 22. The function and structure of feedback transducers 19, 20 and 21 will be described below in greater detail. However, suffice it to note here that any force imparted by motors 16, 17 or 18 to probe 22 is coupled through feedback transducers 19, 20 and 21 respectively. In accordance with an important aspect of the present invention, the force imparted by the piezoelectric motor in each of the three displacement directions is "sensed" by the feedback transducers.

As mentioned above, fixed end 23 of probe 22 is attached by probe attachment 31 to in/out motor 16 in a stationary cantilever fashion. Probe 22 is further attached by probe attachment 40 to vertical motor 17 and by probe attachment 41 to lateral motor 18. Accordingly, it should be noted that motion of in/out motor 16 results in moving the probe 22 and therefore probe contact 24 in the in/out or back and forth directions of motion indicated by arrows 34 and 35. Similarly, motion or geometry changes of vertical motor 17 act upon probe 22 to bend it in cantilever fashion in the vertical plane resulting in motion of probe 22 and more importantly probe contact 24 in the vertical directions indicated by arrows 32 and 33. Similarly, elongation or deformations of lateral motor 18 cause probe 22 to be bent or deflected in cantilever fashion in the horizontal plane and thereby move probe contact 24 in the directions indicated by arrows 36 and 37. It should be noted that pin aperture 15 is of sufficient size to permit the degree of motion or deflection bending or probe 22 desired to move probe contact 24 within the range necessary to accomplish the micropositioning of the present invention system.

To facilitate the proper operation of the present invention system, it has been found desirable to bias probe 22 such that its null position, that it is position in the absence of electrical signals applied to motors 17 and 18, will position probe contact 24 in the downward direction indicated by arrow 32 and to the right direction indicated by arrow 36. This is a matter of design choice and it will be apparent to those skilled in the art that a different null position of probe contact 24 could be chosen without departing from the spirit and scope of the present invention. In accordance with the null positioning of probe contact 24, the micropositioning of the present invention contactor is enhanced in that a return spring force is provided eliminating the need for vertical motor 17 and lateral motor 18 to provide a bidirectional force upon probe 22.

In operation electrical signals are applied to either or all of motors 16, 17 and 18 to move probe 22 and thereby probe contact 24 to the desired position to establish the micropositioned contact. For example, a signal applied to vertical motor 17 which causes it to expand, will bend probe 22 vertically causing probe contact 24 to be moved in the direction of arrow 33. The resistance to bending which probe 22 provides tends to oppose the elongation or vertical force created by vertical motor 17. As vertical motor 17 pushes against probe 22, the resisting force of probe 22 and the force of vertical motor 17 are coupled through vertical feedback transducer 20. Vertical feedback transducer 20 is a piezoelectric structure similar to the laminate structure of vertical motor 17. However, transducer 21 is configured to produce an electrical signal voltage which varies as a function of the mechanical pressure applied to it. Accordingly, the force produced by vertical motor 17 and applied to probe 22 to bend it, in this case in the direction of arrow 33, and the resistance to that motion due to the strength of probe 22, provide a signal which may be utilized by the present invention system to measure the force applied by vertical motor 17 and the resistance offered by probe 22. In accordance with an important aspect of the present invention, the resisting force offered by probe 22 increases dramatically when contact 24 impinges or abuts the target contact of the device under test. Once contact 24 touches or encounters a contact, the resistance to further motion probe 22 in the direction indicated by arrow 33, becomes more than simply the resillience offered by probe 22. In essence, probe contact 24, touching a terminal of the device under test, impedes its further motion. The dramatic increase in resistance to further motion of vertical motor 17 is applied to vertical feedback transducer 20 producing a sharp increase in the output signal of the transducer. In accordance with an important aspect of the present invention, this abrupt increase in output signal from vertical transducer 20 signals the establishment of a contact by probe 24 and is utilized by the circuitry described below in greater detail to respond to the establishment of contact and avoid increased pressure beyond that desired to maintain a workable electrical contact between probe contact 24 and the contact of the device under test. Once contact is established, in addition to merely signally the occurence of electrical contact, vertical feedback transducer 20 provides a continuous signal indicative of the force to which it is subjected and thereby representative of the contact force applied which permits the control system of the present invention micropositionable contactor to establish a predetermined desired contact force.

The operation of lateral motor 18 and lateral feedback transducer 21 is substantially the same as that described for vertical motor 17 and vertical feedback transducer 20 with the exception that the direction of motion imparted to probe contact 24 lies in the direction of arrows 36 and 37. As is the case with vertical motor 17 and vertical feedback transducer 20, the opposing force received by lateral feedback transducer 21 is the combination of the resistance of probe 22 to bending and the establishment of contact between probe contact 24 and the contact of the device under test.

The operation of in/out motor 16 and input feedback transducer 19 with respect to protection of contact between probe contact 24 and the target contact of the device under test, is substantially the same with the exception of the absence of the bending resistance of probe 22. As is apparent from examination of FIG. 1, probe 22 is moved in the directions of arrows 34 and 35 without bending of probe 22. Accordingly, the character of the resisting force received by in/out feedback transducer 19 during the travel of probe 22 in the directions of arrows 34 and 35, is somewhat different. However, upon contact of probe contact 24 with the target terminal of the device under test, the previously described sharp increase in signal output from in/out feedback transducer 19 results. Further, the use of the signal produced by in/out feedback transducer 19 to maintain a desired contact force is facilitated in the same manner as described above for vertical motor 17 and lateral motor 18.

The basic operation of the present invention micropositionable system will be set forth below in greater detail in connection with the following drawing figures. However, suffice it to note here that in accordance with an important aspect of the present invention, the signals applied to in/out motor 16, vertical motor 17 and lateral motor 18 may be applied in an incremental or stair step fashion which will cause probe contact 24 to move upwardly in the direction of arrow 33 and to the left in the direction of arrow 37 and outwardly in the direction of arrow 34 in a predictable prescribed incremental fashion whereby probe contact 24 commences motion from a point remote from the target contact of the device under test and is moved in an incremental fashion toward the contact. In further accordance with the advantage of the present invention system being described, the use of incremental voltages to progressively move contact 24 toward the device under test contact, permits contact 24 to "zero in" on the target contact of the device under test in accordance with the selected directions desired by the system. While the zeroing in or probe 24 may be simultaneously carried forward using combinations of motors 16, 17 and 18, the motors may be operated singularly or in pairs to meet the needs of a particular device structure.

It should be noted that regardless of whether motors 16, 17 and 18 are operated in pairs individually or all simultaneously, the establishment of contact at a given increment of voltage applied to a given motor in the direction of operation, provides the basis of a repeatable positioning of the probe to reestablish contact with the target contact of the device by simply reapplying that voltage to the particular motor. The importance of this repeatability will be described more fully below.

FIG. 2 sets forth an alternate embodiment of the three-dimensional piezoelectric contactor set forth in FIG. 1, which provides the further improvement of probe alignment using pairs of piezoelectric motors operative in each of the three directions. Accordingly, contactor, generally referenced by number 260, comprises a base 261 having a motor support 271 generally perpendicular to base 261. A piezoelectric stack motor 262, similar to construction to the piezoelectric motor set forth above in conjunction with FIG. 1, includes a feedback transducer 266 at one end which in turn supports a probe attachment 263. Piezoelectric stack motor 260 is attached to motor support 271 in a similar manner to that set forth above. Probe attachment 263 further defines an aperture 264 and a fastener 265. A stack motor 267, similar in construction to stack motor 262, is attached to motor support 271 at one end and supports a feedback transducer 270 at the other. A probe attachment 268 defines a probe aperture 269. Probe apertures 269 and 264 are in substantial axial alignment along the axis defined by arrows 288 and 289, which as described below, more fully comprise the in and out directions of motion respectively of the present invention contactor. An elongated metal probe 285 defines a fixed end 286 and a contactor 287. Probe 285 is passed through apertures 269 and 264 attachments 268 and 263 respectively. Fastener 265 is threaded into probe attachment 263 and engages the portion of fixed end 286 of probe 285 within aperture 264 to secure probe 285 to probe attachment 263 and thereby stack motor 262. It should be noted at this point that no fastener is operative upon the portion of probe 285 passing through aperture 269 of probe attachment 268.

A base 272 defines a motor support surface 273. A stack motor 274, similar in construction to the foregoing described piezoelectric stack motors, is secured to motor support 273 at one end and supports a feedback transducer 275 at the other end. A stack motor 276, also similar in construction to the foregoing described piezoelectric stack motors, is secured to motor support surface 273 at one end and defines a feedback transducer 277 at the other end.

A base 278 defines a motor support 279 and a motor support surface 282. A piezoelectric stack motor 280 similar in construction to the above described piezoelectric stack motors, is secured at one end to motor support 279 and supports a feedback transducer 281 at the other end. A pair of low-friction slide pads 283 and 284 are attached to motor support surface 282 in a substantially parallel arrangement.

The structure set forth in FIG. 2 is a pictorial representation of a contactor constructed in accordance with the present invention in which the various electrical connections have been omitted for the purpose of clarity. However, it should be understood that the piezoelectric motors and probe contactors set forth in FIG. 2 are operative with appropriate electrical connections as set forth below in greater detail. The purpose of FIG. 2 however, is to set forth the details of the present invention contactor probe and motor mechanism leaving detailed descriptions of the electrical interconnections to be described below. As mentioned, the structure set forth in FIG. 2 is shown in exploded view or assembly drawing form in that the three basic elements shown are assembled together in a common structure to provide the appropriate movement of probe 285 in accordance with the present invention. Thus, when assembled, base 272 is positioned with respect to and rests upon motor support surface 282 of base 278 such that motor support 273 rests upon slides 283 and 284 while base 272 is attached to feedback transducer 281 of stack motor 280. As will be apparent, the resulting sub-assembly of base 272 and base 278 described, results in a combined structure in which the deformation of stack motor 280 causing it to extend outwardly or withdraw inwardly, result in moving base 272 back and forth across slides 283 and 284. In a similar manner, base 261 is assembled to base 272 such that base 261 rests upon and is attached to feedback transducers 275 and 277 of stack motors 274 and 276 respectively. The resulting structure of assembled base 261, 272 and 278 provides an integral structure in which the motion of probe 285 is controlled by the operation of the various piezoelectric motors in the following manner. Operation of piezoelectric stack motor 280 toward or away from motor support 279 causes a corresponding motion in base 272 back and forth across slides 283 and 284. In turn, this motion is imparted to base 261 and thereby provides motion of probe 285 in the axis of motion defined by arrows 289 and 288. This axis of motion defines motion of probe contact 287 toward or away from the target contact of the device under test. Accordingly, an electrical signal applied to stack motor 280 causing it to expand will move base 272 away from motor support 279, which in turn moves base 261 and thereby probe 285 in the direction indicated by arrow 289. Conversely, a reduction of the electrical signals applied to stack motor 280 causing a smaller extension of the motor will draw base 272 toward motor support 279 and accordingly move base 261 and thereby probe contact 287 in the direction indication by arrow 288.

Similarly, activation of motors 276 and 274 on base 272 cause base 261 to be moved vertically in the directions indicated by arrows 290 and 291. In the event motors 274 and 276 are operated in unison, the motion of base 261 is vertical with no tilting thereof. In such event, probe contact 287 is moved either upward in the direction of arrow 290 or downward in the direction indicated by arrow 291. However, in accordance with an important aspect of the present invention, the stack motors 274 and 276 may, in addition to operation in unison, be operated in different increments whereby one motor is caused to move a greater distance than the other resulting in a change in the angle between base 261 and motor support 273. This angular change is in turn imparted to probe 285. For example, in the event stack motor 276 is extended a greater distance than stack motor 274, the angle between probe 285 and motor support 273 is altered such that contact 287 is raised higher in the direction indicated by arrow 290, while fixed end 286 is moved in a direction lower, indicated by arrow 291. Of course, in the event stack motor 274 is moved a greater extension distance than 276, the opposite tilting of probe 285 occurs.

By similar manner, stack motors 262 and 267 are operative upon probe 285 to move contact 287 along the axis defined by arrows 292 and 293. Also, in further similarity to the operation of motors 274 and 276, motors 262 and 267 may be operated in unison, that is equal deformations in which case probe 285 is moved in a manner whereby the angle of probe 285, in the directions indicated by arrows 292 and 293, remains constant. On the other hand, motors 262 and 267 may be operated by different extension increments resulting in a change in the angle between probe 285 and motor support 271. For example, in the event stack motor 262 is extended farther, or by a greater amount than stack motor 267, fixed end 286 of probe 285 is moved in the direction of arrow 293 while contact 287 is moved in the direction of arrow 292. Conversely, in the event stack motor 267 is moved by a greater increment than stack motor 262, fixed and 286 of probe 285 is moved in the direction indicated by arrow 292 and contact 287 is moved in the direction indicated by arrow 293.

In operation, the embodiment of the present invention contactor shown in FIG. 2 may be utilized in a manner similar to that set forth in the embodiment of FIG. 1, in that appropriate voltages applied to motor 280 may be used to move contact 287 in the directions of arrows 288 and 289. Motors 274 and 276 may be operated in unison to move probe 285 in the directions indicated by arrows 290 and 291. Motors 262 and 267 may be operated in unison to move probe 285 in the directions indicated by arrows 292 and 293. When so operated, the function of the embodiment of FIG. 1 is essentially the same of that set forth above for FIG. 2. As has been described, motors 274 and 276 may be operated by different extensions to permit change in the alignment of probe 285. In accordance with an important aspect of the present invention therefore, the alignment of probe 285 may be carried forward virtually entirely by the application of appropriate voltages to motors 262, 267, 274, 277 and 280. As a result, virtually no mechanical set up or alignment of the contactor assembly is necessary to assure that probe 285 is properly aligned. In addition, the capability of the embodiment of FIG. 2 to carry forth the alignment of the angular relationship between probe 285 and the device under test, permits the complete adjustment of the contactor by use of electrical signals to compensate for variations in the device under test.

FIG. 3 sets forth a plan view of the multiple contactors constructed in accordance with the present invention. It should be noted that the embodiment shown in FIG. 3 is directed to addressing a device under test having sixteen accessible contacts. However, it will be apparent to those skilled in the art that this example is selected for explanation and illustration and that the present invention micropositionable contactor system may be utilized to test devices having substantially more or substantially fewer addressable contacts without departing from the spirit and scope of the present invention.

A support base 41 supports an array of in/out motors 42 through 57 inclusive which are arranged in groups of four in accordance with the geometry of device under test 150. Each of in/out motors 42 through 57 supports an in/out transducer 93 through 108 respectively and is attached to one end of a probe 61 through 76 respectively. The combination of in/our motors, feedback transducers and probes set forth in FIG. 3 are each substantially the same as that described for in/out motor sixteen and in/out feedback transducer 19 attached to probe 22 in FIG. 1. A plurality of vertical motors 77 through 92 are coupled to probes 61 through 76 respectively and are of similar construction to vertical motor 17. Vertical motors 77 through 92 each include a respective feedback transducer in similar arrangement to that shown for vertical feedback transducer 20 of FIG. 1. A pin guide 151 comprises a four-sided wall surrounding device under test 150 and defines a plurality of pin apertures 152 through 167. Probes 61 through 76 pass through pin apertures 152 through 167 respectively and terminate in probe contacts 109 through 124 respectively. Device under test 150 includes a plurality of accessible contacts 25 through 140 spaced about its periphery. As will be apparent to those skilled in the art, the orientations of the individual motor and probe structures as well as the pin apertures trhough which the individual probes pass, is selected to provide appropriate alignment with the accessible contacts of device under test 150. Accordingly, the arrangement and orientation of probes 61 through 76 and the respective pin apertures 152 through 167 would be altered to suit a different configuration of contacts 125 through 140 of device under test 150 in the event a different configuration of the device is encountered.

It should be noted that the positioning of in/out motors 42 through 57 and vertical motors 77 through 92 external to pin guide 151 permits a close spacing of probe contacts 109 through 124 in the event device under test 150 is extremely small. The proximity of contacts which can be accomodated by the present invention system is in essence limited solely by the size of probe contacts 109 through 124 and the minimum spacing necessary therebetween to avoid contact.

It should also be noted in FIG. 3 that unlike the embodiment illustrated in FIG. 1 in which three stack motors are operative upon probe 22 to provide motion in three directions, the probe and motor combinations set forth in FIG. 2 provide two rather than three motors operative on each of probes 61 through 76. FIG. 3 therefore, is illustrative of a system in which fine positioning of probe contacts 109 through 124 is necessary only in the in/out and vertical directions and not in the lateral direction. It should be apparent however to those skilled in the art that the probe and stack motor combination shown in FIG. 3 could just as simply have included the third lateral motor operative upon the individual probes.

Figure 4:
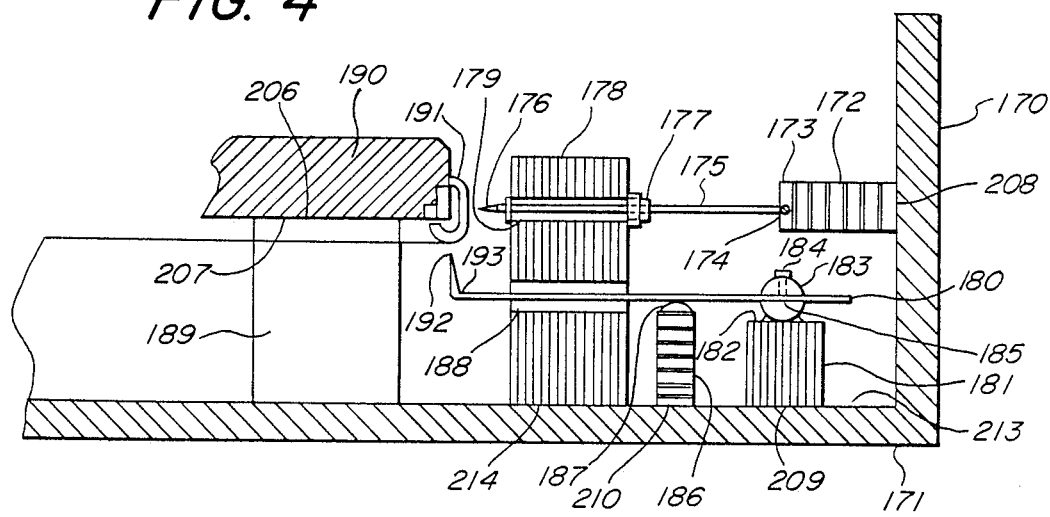
FIG. 4 is a section view of a portion of a microposi- tionable contactor constructed in accordance with the present invention using a piezoelectric stack motor configuration.

FIG. 4 sets forth an alternate embodiment of the present invention micropositionable contactor in which a vertical support 170 and a floor 171 form mutually perpendicular support surfaces for a device support 189 which defines a reference surface 206. An in/out piezoelectric motor 172 similar in construction to the stack motor configurations set forth above, is attached to reference surface 212 of vertical support 170 by a bond 208, bond 208 may, for example, comprise a simple deposited epoxy adhesive. Motor 172 further defines an in/out transducer 173 at its end remote from bond 208 and a probe attachment 174. A guide 178 is attached to reference surface 213 of floor 171 by a bond 214. Bond 214 may, for example, be an adhesive bond such as epoxy or a weld bond in the event guide 178 is formed of a metallic material. Guide 178 defines a plurality of guide apertures (shown more clearly in FIG. 5) including a guide aperture 179. A probe bushing 177 is positioned within guide aperture 179. A probe 175 having a generally elongated cylindrical metallic structure terminates at one end in probe attachment 174 attached to in/out motor 72 and in the other end at probe contact 176. Probe 175 passes through and is supported and aligned by probe bushing 177. As can be seen, the action of in/out motor 172 causes probe 175 to be driven toward or away from device support 189.

A pedestal 181 is bonded by a bond 209 to reference surface 213 on one end and terminates in a surface 182 on the other end. A probe attachment 183 defines an aperture 185 and a set fastener 184. Set fastener 184 is threaded into probe attachment 183 such that it intrudes into aperture 185 in accordance with the commonly fabricated fastener known as a "set screw". An elongated metallic probe 180 is supported within aperture 185 and maintained in a fixed position therein by set fastener 184. Probe 180 further defines a perpendicular bend 193 and a contact 192 at its extreme end. Probe 180 is tightly maintained within probe attachment 183 such that no rotation of probe 180 occurs. As a result, probe contact 192 remains upwardly facing. A vertical stack motor 186 constructed in a similar fashion to the piezoelectric stack motors referred to and described above, is bonded by a bond 210 to reference surface 213 on one end and terminates in a vertical feedback transducer on the other end. In accordance with an important aspect of the present invention structure, probe attachment 183 maintains probe 180 in tight contact with vertical transducer 187 in all geometric extensions of vertical motor 186. In other words, probe 180 is biased into contact with vertical transducer 187. Probe 180 passes through a guide aperture 188 in guide 180. Unlike the probe bushing 177 supporting 175, guide aperture 188 is substantially larger than the portion of probe 180 extending through it. As a result, probe 180 may be deflected in the vertical direction by a substantial distance without interference between probe 180 and guide aperture 188. A device under test 190 defines a reference surface 206 which is maintained in contact by means not shown with reference surface 207 of device support 189. Suffice it to note here that any number of mechanical retaining means may be employed to fixedly retain a device under test 190 in a fixed repeatable position upon reference surface 206. Device under test 190 further includes a plurality of device contacts in an arrangement which may, for example, be similar to that set forth above for device under test 150 in FIG. 3. Device under test 190 includes, among such device contacts, a device contact 191. It should be understood that device contact 191 is the target contact of probes 175 and 180. Again, with reference to FIG. 3 above, the arrangement set forth in FIG. 4 depicts the relationship between contacts and probes shown in FIG. 3 in that the probe and motor arrangement are aligned to service a selected or target contact. It should be understood that the complete structure of the embodiment shown in FIG. 4 would typically include a multiple set of piezoelectric motor probe and probe guide apertures arranged in alignment with each target contact, again, not unlike the configuration shown in FIG. 3. However, FIG. 4 is restricted to a sample of a single pair of driven probes to facilitate description and should be taken with the understanding that multiple probe pairs for each contact would of course be employed in the completed micropositionable contactor of the present invention.

In accordance with an important aspect of the present invention it should be noted that device support 189, guide 178, vertical motor 186 and pedestal 181, FIG. 4, are all attached to and therefore referenced from reference surface 213 of floor 171. Accordingly, and in accordance with an important aspect of the present invention, the motions of probe contact 192 toward or away from reference surface 213, may be directly interpreted by the remainder of the contactor system to establish the vertical position of probe 192 in space at any given time by referencing its position to reference surface 213. Similarly, because device under test 190 is maintained in a fixed position upon device support 189 at a repeatable distance from reference surface 212 of vertical support 170 and because the motions of in/out motor 172 move probe contact 176 with reference to reference surface 212, the position in a horizontal direction of probe contact 176 is determined in space by reference to its distance from reference surface 212.

It should be understood that for purposes of clarity and ease of description, the plurality of electrical connections to in/out motor 172 and vertical motor 186 have been omitted from FIG. 4. Accordingly, reference will be made in the discussions of operation relating to FIG. 4 which follow, to the actions of motors 172 and 186 on the assumption that appropriate electrical signals to accomplish those actions are being applied. The specific operation of producing motor drive signals will be described below in greater detail in connection with FIG. 7. In accordance with the above described function of in/out motor 172, probe 175 may be moved by the action of motor 172 toward or away from device contact 191 by the action of motor 172. The motion of probe 175 as mentioned, is restricted to a single axis by probe bushing 177. Accordingly, contact between probe contact 176 and device contact 191 is accomplished by driving stack motor 172 with an appropriate signal which produces extension of motor 172 to a sufficient dimension to drive probe contact 176 to device contact 191.

Similarly, the cantilever type mounting of probe 180 permits the elongation of vertical motor 186 to bend probe 180 upwardly thereby moving probe contact 192 toward device contact 191. Conversely, reducing the elongation of vertical motor 186 permits the spring force of probe 180 to drive probe contact 192 away from device contact 191. As a result, when an electrical signal of sufficient magnitude is applied to vertical motor 186, its extension will be sufficient to produce sufficient bending of probe 180 to drive probe contact 192 into contact with device contact 191.

In contrast to the embodiment set forth in FIG. 1, the embodiment of FIG. 4 employs a pair of probes operable upon a single device contact. Probes 175 and 180 may, in accordance with another aspect of the present invention, be operated as a "force-sense pair". Such a contact pair is characterized by the simultaneous use of two contacts to operate on a single target contact. In the operation of a force-sense pair, one of the contacts is coarsely driven to establish contact with the target contact of the device and an electrical sensing device is connected to the pair of probes. So long as the second contact has not established connection to the target contact of the device, the sensing apparatus does not respond. Thereafter, movement of the second contact into contact with the device contact causes the sensing device to respond and the testing system confirms that a contact has been made. The force-sense pair operation of the embodiment shown in FIG. 4 is carried forward as follows, an electrical signal is applied to in/out motor 172 of sufficient magnitude to drive probe contact 176 into abutment with device contact 191. Thereafter, an incremental stair step signal is applied to vertical motor 186 which causes probe contact 192 to be moved toward device contact 191 by a series of corresponding increments. Once probes contact 192 touches device contact 191, a circuit is completed between probe 175 and probe 80 through device contact 191 and sensing means within the system (not shown) cause the last applied voltage to vertical motor 186 to be stored for future reference. As a result, the stored signal from vertical motor 186 constitutes a reference signal which may repeatedly place probe contact 192 into contact with device contact 191. In addition, and because vertical motor 186 is referenced to reference surface 213 along with device support 189, the extension of vertical motor 186 defines the position of the underside of device contact 191 in a repeatable fashion.

The embodiment shown in FIG. 4 may operate the force-sense pair activities in the converse of that just illustrated in that vertical motor 186 may be coarsely driven to establish connection between probe contact 192 and device contact 191 and the same sensing circuit applied to probes 175 and 180. Thereafter, in/out motor 172 is incrementally driven by a stair step voltage causing probe contact 176 to be incrementally driven toward device contact 191. As in the previous case, the touching of probe contact 176 against device contact 191 causes the last applied voltage to motor 172 to be stored giving a reference voltage which defines the position of probe contact 191 in the horizontal direction with respect to reference surface 212. It will be apparent to those skilled in the art that the foregoing described operation establishes the position of device contact 191 with respect to reference surfaces 212 and 213.

FIG. 5 shows a portion of guide 178 as viewed from device contact 191 showing the configurations of guide apertures 179 and 188. As can be seen, guide aperture 179 is substantially circular in cross section, while guide aperture 188 is elongated in the vertical direction. As mentioned, the elongation of guide aperture 188 permits probe 180 to be deflected in the vertical direction by the action of vertical motor 186. Guide 178 includes a plurality of guide apertures 194 through 199, each similar to guide aperture 179 and a plurality of guide apertures 200 through 205 similar to guide aperture 188. As mentioned, in the embodiment of FIG. 4, a pair of guide apertures would be aligned with each of the device under test contact to permit a probe pair, such as probes 175 and 180, to be operative upon each of the individual device contacts.

FIG. 6 sets forth an alternate embodiment of the present invention micropositionable contactor which utilize a bimorph motor as the probe moving device, rather than the stack motor or the previous embodiments. A support 215 is stationary positioned with respect to a device under test 245 and supports a pedestal 216. A probe attachment 217 defines an aperture 218 and a set fastener 219. An elongated metal probe 220 is positioned at one end within aperture 218 and secured therein by set fastener 219 and definex a right angled probe contact 227. A guide 225 is supported upon support 215 and defines a guide slot 226. In accordance with the invention, guide slot 226 is aligned in the direction permitting probe 220 to be moved toward or away from device contact 246. A bimorph motor 221 which comprises a plurality of laminations 222, 223 and 224, is secured at one end in a cantilever fashion to pedestal 216. Bimorph motor 221 is constructed in accordance with the prior art techniques of fabricated bimorph benders and responds to an applied voltage by deforming in a curved manner such that bimorph motor 221 applies a force upon probe 220 to drive probe contact 227 through guide slot 226 toward device contact 246.

A support 228 supports a pedestal 229, which in turn supports, in a cantilever fashion, a second bimorph motor 237. Bimorph motor 237 is fabricated in accordance with conventional bimorph bender techniques and comprises a plurality of laminations 238, 239 and 240. A probe attachment 230 is supported upon pedestal 229 and defines an aperture 231 and a set fastener 232. A probe 233 comprises an elongated metallic structure having its first end secured within aperture 231 of probe attachment 230 by set fastener 232. The other end of probe 233 terminates in a right angled probe contact 234. A guide 235 is supported upon support 228 and defines a guide slot 236. In accordance with the foregoing descriptions of bimorph motor 221, bimorph motor 237 functions in a similar manner, whereby an electrical signal applied thereto causes bimorph motor 237 to exert a bending force against probe 233, and thereby drive probe contact 234 toward device contact 246. A device support 242 is supported upon reference surface 241 of support 228 and defines a reference surface 244. A device under test 245 defines a reference surface 243 which is maintained in fixed position upon and in contact with reference surface 244.

The operation of the embodiment shown in FIG. 6 is substantially the same as that set forth above in connection with FIG. 4 with the exception that probes 220 and 233 are moved by the bending actions of bimorph motors 221 and 237 respectively, rather than the stacked motor configuration shown in FIG. 4. The choice between the embodiment of FIG. 4, and that shown in FIG. 6, is largely one of design choice with the advantage of the embodiment of FIG. 6 found primarily in its ability to more closely position the probe contact pairs and thereby accommodate devices for test having more closely spaced contacts. The operation, however, remains essentially the same in that probes 220 and 233 may be operated as a force and sence pair in the same manner described above.

FIG. 7 shows a front view of guide 235 showing the elongated slot of guide slot 236. Guide 235 defines a plurality of guide slots 247 through 251 which accommodate a plurality of probes, such as probes 233 or 220. In contrast to the embodiment of FIG. 4, the embodiment of FIG. 6 utilizes substantially the same guide structures for both probes.

Figure 8:
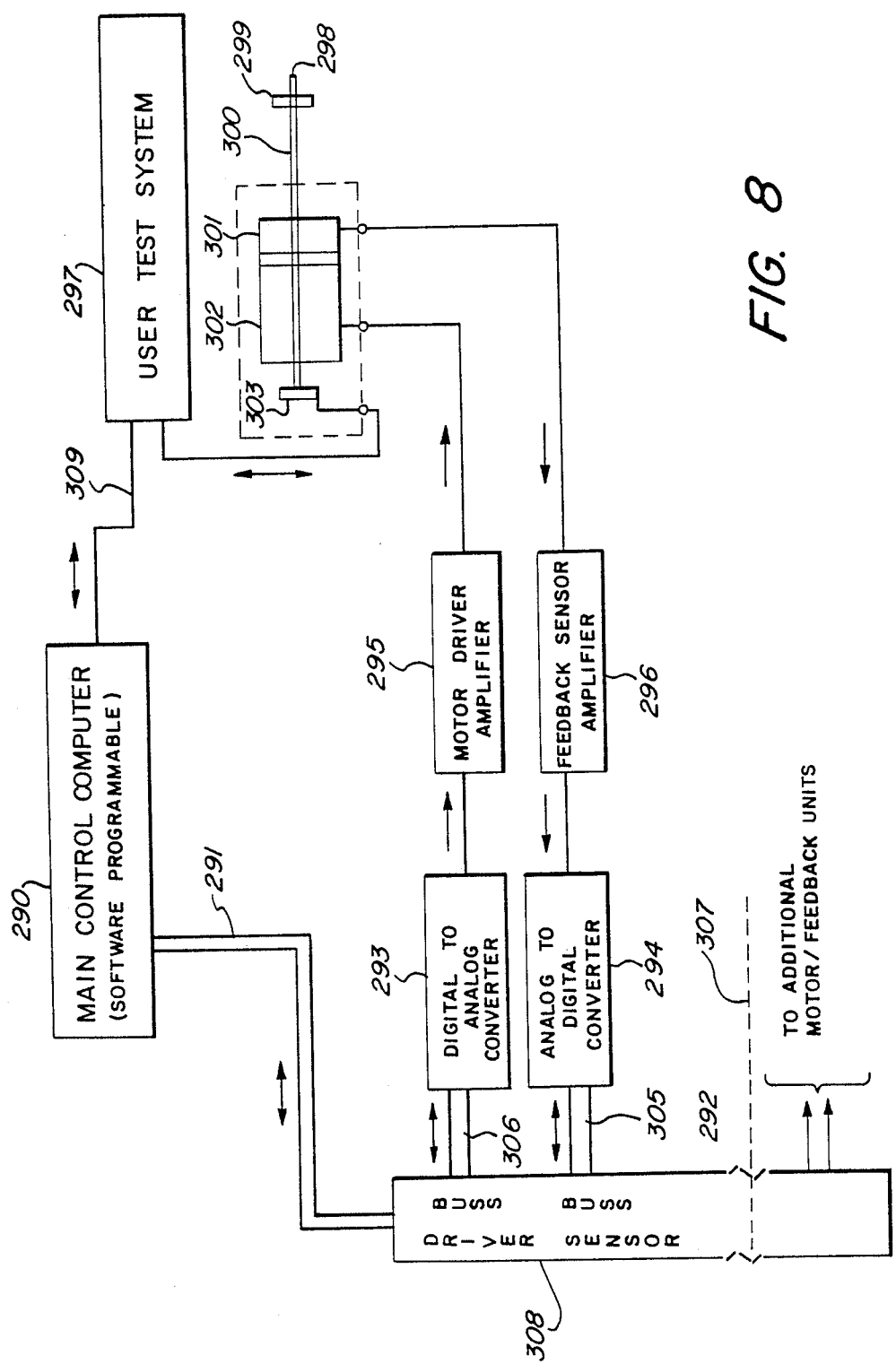
FIG. 8 is a block diagram representation of a micropositionable contactor construed in accordance with the present invention.

FIG. 8 shows a block diagram representation of the control system of the present invention micropositionable contactor operable on a single piezoelectric motor 302. It should be understood that the control system of FIG. 8 is illustrative of the controls operative on each of the motors described above. It should be further understood that numerous alternative controls for the piezoelectric motors of the present invention contactor system may be used in place of the system of FIG. 8 without departing from the spirit and scope of the present invention.

A main control computer 290 includes conventional computing means and an associated memory housing a stored set of program instructions (not shown) which in accordance with well-known computing methods cause computer 290 to respond to commands from the user or operator and carry forward one or more selected sequences of contactor actions. A drive bus 292 includes well-known circuitry for processing multiple electronic signals simultaneously. A data line 291 is coupled between computer 290 and bus 292. A digital to analog converter 293 is coupled to bus 292 by a data line 293. A motor driver amplifier 295 couples the analog output signal of converter 293 to a piezoelectric motor 302. Motor 302 includes a feedback transducer 301. A probe 300 includes a contact 298 at one end and a probe support 303 at the other end. The latter includes means for making connection to a conductor 304. A user test system 297 includes appropriate electrical testing systems (not shown ) which recieve and transmit information via probe 300 to and from the device under test. An analog to digital converter 294 is coupled to bus 292 by a data line 305. A feedback transducer amplifier 296 is coupled between converter 294 and feedback transducer 301.

In operation, computer 290 responds to a command from user system 297 via connection 309 to move probe 300. Computer 290 produces a digital signal representing the next position of probe 300 desired. This next position may be either a single increment in the event the above-described stepping process is under way or it may be a previously determined "final position". In either event, the digital position signal is coupled by bus 292 to converter 293. The output signal of converter 293 is amplified by amplifier 295 and applied to motor 302 which in turn moves probe 300. Once the desired contact is established, a signal is produced by feedback transducer 301. The output of transducer 301 is an analog signal which is amplified by amplifier 296 and applied to converter 294. The signal from amplifier 296 is changed to a digitally coded signal by converter 294 indicative of the pressure upon transducer 301. Data line 305 couples the feedback signal to bus 292 which in turn applies it to computer 290. In the event the coded signal from converter 294 reaches the predetermined limit established in computer 290, the computer ceases further motion of probe 300.

Dashed line 307 separates extension 308 of bus 292 from the described motor control. It will be understood that the above combination of converters 293 and 294, amplifiers 295 and 296, and motor 302 and transducer 301 are repeated for each motor within the present invention contactor system.

While particular embodiments of the invention have been shown and described, it will be obvious to those skilled in the art that changes and modifications may be made without departing from the invention in its broader aspects. Therefore the aim in the appended claims is to cover all such changes and modifications as fall within the true spirit and scope of the invention.

What is claimed is:

1. A micropositionable contactor for use in determining the position of and establishing a testing connection to a selected terminal of a deive under test, said micropositionable contactor comprising:

a probe having a first portion supporting an electrical contact and means for making electrical connection thereto a first piezoelectric motor, responsive to a first applied voltage, coupled to and acting upon said probe to move said electrical contact in a first direction to selected positions in response to predetermined applied voltages;

first sensing means coupled to said first piezoelectric motor and said probe for sensing the establishment of contact between said electrical contact and said selected terminal providing a first output signal; and a digital computer, having a processor and associated memory containing a stored instruction set, producing digitally encoded first direction position signals, and including means for converting said digitally encoded first direction position signals to corresponding first applied voltages, said digital computer operative to increment said digitally encoded first direction position signals and thereby increment the voltage applied to said first piezoelectric motor causing the position of said electrical contact to be incremented in said first direction in an iterative process until said first sensing means senses the establishment of contact in said first direction between said electrical contact and said terminal.

2. A micropositionable contactor as set forth in claim 1 wherein said digital computer responds to establishment of contact in said first direction between said terminal and said electrical contact by storing the digital code corresponding to said first direction position signal at contact establishment in said first direction in said memory and wherein said computer includes:

means for recovering said stored digital code corresponding to said first direction position signal at contact establishment in said first direction and reestablishing contact between said electrical contact and said terminal on command.

3. A micropositionable contactor as set forth in claim 2 wherein said digital computer produces digitally encoded second direction position signals and wherein said micropositionable contactor further includes:

a second piezoelectric motor, responsive to a second applied voltage, coupled to and acting upon said probe to move said electrical contact in a second direction to selected positions in response to predetermined applied voltages; and second sensing means coupled to said second piezoelectric motor and said probe for sensing the establishment of contact between said electrical contact and said selected terminal providing a second output signal.

4. A micropositionable contactor as set forth in claim 3 wherein said digital computer is operative to increment said digitally encoded second direction position signals and thereby increment the voltage applied to said second piezoelectric motor causing the position of said electrical contact to be incremented in said second direction in an iterative process until said second sensing means senses the establishment of contact in said second direction between said electrical contact and said terminal.

5. A micropositionable contactor as set forth in claim 4 wherein said digital computer produces digitally encoded third direction position signals and wherein said micropositionable contactor further includes:

a third piezoelectric motor, responsive to a third applied voltage, coupled to and acting upon said probe to move said electrical contact in a third direction to selected positions in response to predetermined applied voltages; and third sensing means coupled to said third piezoelectric motor and said probe for sensing the establishment of contact between said electrical contact and said selected terminal and providing a third output signal.

6. A micropositionable contactor as set forth in claim 5 wherein said digital computer is operative to increment said digitally encoded third direction position signals and thereby increment the voltage applied to said third piezoelectric motor causing the position of said electrical contact to be incremented in said third direction in an iterative process until said third sensing means senses the establishment of contact in said third direction between said electrical contact and said terminal.

7. A micropositionable contactor as set forth in claim 6 wherein said first, second, and third directions are mutually orthogonal.

8. A micropositionable contactor as set forth in claim 1 wherein said first piezoelectric motor comprises a stack motor having a first plurality of interleaved layers of piezoelectric material and metallic material and wherein said first sensing means includes:

a piezoelectric feedback transducer interposed between said first piezoelectric motor and said probe so as to recieve a compressive force when said electrical contact impacts said selected terminal and responding to said compressive force to produce an electrical signal indicative to contact.

9. A micropositionable contactor for use in establishing a testing connection to a selected terminal of a device under test, said micropositionable contactor comprising:

a probe having a first portion supporting an electrical contact, and means for making electrical connection thereto;

a first piezoelectric motor, responsive to a first applied voltage coupled to and acting upon said probe to move said electrical contact in a first direction to selected positions in response to said first applied voltage;

a second piezoelectric motor, responsive to a second applied voltage, coupled to and acting upon said probe to move said electrical contact in a second direction to selected positions in response to said second applied voltage;

a digital to analog converter defining an output port coupled to said first and second piezoelectric motors and an input terminal, a digital computer having a processor and an associated memory containing a stored instruction set; and sensing means coupled to said first piezoelectric motor and said probe for sensing the establishment of contact between said electrical contact and said terminal;

said computer operative to increment a digital signal applied to said digital to analog converter and thereby to increment the voltages applied to said first and second piezoelectric motors which in turn respond to increment the position of said electrical contact in said first and second directions in an iterative process until said sensing means senses the establishment of contact between said electrical contact and said terminal.

10. A micropositionable contactor for use in establishing a test connection to a selected terminal of a device under test, said micropositionable contactor comprising:

a first probe supported in a manner permitting movement in a first direction and having a first electrical contact and means for making electrical connection thereto;

a second probe supported in a manner permitting movement in a second direction and having a second electrical contact and second means for making an electrical connection to said second electrical contact;

a first piezoelectric motor, coupled to said first probe for moving said first electrical contact in a first direction in response to an applied voltage;

a second piezoelectric motor coupled to said second probe moving said second electrical contact in a second direction in response to an applied voltage;

computing means having an associated memory and a stored set of instructions therein for providing digitally encoded position signals;

a digital to analog converter coupled to said computing means receiving said digitally encoded position signal therefrom and producing a corresponding analog voltage output; and switching means selectively applying said analog voltage output to either of said first or said second piezoelectric motors;

said computing means incrementing said first and second piezoelectric motors to operate said first and second probes as a force sense pair for a selected terminal on the device under test by outputting the digitally encoded position signals to said analog to digital converter and actuating said switch.

* * * * *